(12) United States Patent
Tanaka

(10) Patent No.: US 11,879,449 B2
(45) Date of Patent: Jan. 23, 2024

(54) PIEZOELECTRIC PUMP WITH VIBRATING PLATE, PROTRUSION AND VALVE ARRANGEMENT

(71) Applicant: Murata Manufacturing Co., Ltd., Kyoto (JP)

(72) Inventor: Nobuhira Tanaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 302 days.

(21) Appl. No.: 17/329,684

(22) Filed: May 25, 2021

(65) Prior Publication Data

US 2021/0277883 A1   Sep. 9, 2021

Related U.S. Application Data

(63) Continuation of application No. PCT/JP2019/046176, filed on Nov. 26, 2019.

(30) Foreign Application Priority Data

Nov. 27, 2018 (JP) .................................. 2018-221450

(51) Int. Cl.
*F04B 43/04* (2006.01)
*H10N 30/20* (2023.01)
(Continued)

(52) U.S. Cl.
CPC .......... *F04B 43/046* (2013.01); *F04B 45/045* (2013.01); *F04B 45/047* (2013.01); *H10N 30/20* (2023.02)

(58) Field of Classification Search
CPC .... F04B 43/046; F04B 45/045; F04B 45/047; H10N 30/20
See application file for complete search history.

(56) References Cited

U.S. PATENT DOCUMENTS 5,171,132 A    12/1992 Miyazaki et al.
8,297,947 B2 * 10/2012 Van Rensburg .......... F04F 7/00
                                                              417/213
(Continued)

FOREIGN PATENT DOCUMENTS

AU      2009347420 A1    12/2011
CN       101589233 A     11/2009
(Continued)

OTHER PUBLICATIONS

International Search Report for International Application No. PCT/JP2019/046176 dated Feb. 18, 2020.
(Continued)

*Primary Examiner* — Nathan C Zollinger
(74) *Attorney, Agent, or Firm* — Pearne & Gordon LLP

(57) ABSTRACT

The present disclosure includes: a vibrating plate having a piezoelectric body connected to a main surface thereof; a cover including a top plate that faces another main surface of the vibrating plate and that has an opening part, and a side wall connected to an outer peripheral portion of the top plate so as to surround a space between the top plate and the vibrating plate; a support portion connected to the side wall and supports an outer periphery of the vibrating plate; an opening between the side wall and the vibrating plate; and a protrusion on any one out of the top plate, the side wall, and the vibrating plate so as to protrude into the space. The protrusion is provided between the opening part of the top plate and the side wall in a cross section.

20 Claims, 15 Drawing Sheets

(51) Int. Cl.
*F04B 45/047* (2006.01)
*F04B 45/04* (2006.01)

(56) References Cited

U.S. PATENT DOCUMENTS

| | | | |
|---|---|---|---|
| 9,631,730 | B2 | 4/2017 | Kotani et al. |
| 11,043,444 | B2 * | 6/2021 | Ganti ................. H05K 7/20272 |
| 11,441,555 | B2 * | 9/2022 | Tanaka ................. F04B 45/047 |
| 2010/0074775 | A1 | 3/2010 | Yamamoto et al. |
| 2013/0266461 | A1 | 10/2013 | Hirata et al. |
| 2013/0280105 | A1 | 10/2013 | Locke et al. |
| 2014/0294629 | A1 | 10/2014 | Kim et al. |
| 2018/0051686 | A1 | 2/2018 | Tanaka et al. |
| 2018/0066650 | A1 | 3/2018 | Fujisaki et al. |
| 2018/0187669 | A1 | 7/2018 | Liao et al. |
| 2021/0324844 | A1 * | 10/2021 | Tanaka ................. F04B 45/047 |

FOREIGN PATENT DOCUMENTS

| | | | | |
|---|---|---|---|---|
| CN | 102459900 | A | 5/2012 | |
| CN | 107532584 | A | 1/2018 | |
| CN | 107781144 | A | 3/2018 | |
| GB | 2554231 | A * | 3/2018 | ............. F04B 19/22 |
| JP | H02-308988 | A | 12/1990 | |
| JP | 2012-528980 | A | 11/2012 | |
| JP | 5177331 | B1 | 4/2013 | |
| JP | 2017-207069 | A | 11/2017 | |
| JP | 2018-009464 | A | 1/2018 | |
| JP | 2018-109407 | A | 7/2018 | |
| WO | WO-2009148005 | A1 * | 12/2009 | ............ F04B 45/047 |
| WO | 2010/139916 | A1 | 12/2010 | |
| WO | 2012/140967 | A1 | 10/2012 | |
| WO | 2016/181833 | A1 | 11/2016 | |

OTHER PUBLICATIONS

Written Opinion for International Application No. PCT/JP2019/046176 dated Feb. 18, 2020.
Extended European Search Report for 19888722.6 dated Mar. 26, 2022.

* cited by examiner

OUTSIDE ⟷ INSIDE

OUTSIDE ⟷ INSIDE

PIEZOELECTRIC PUMP WITH VIBRATING PLATE, PROTRUSION AND VALVE ARRANGEMENT

CROSS REFERENCE TO RELATED APPLICATIONS

This is a continuation of International Application No. PCT/JP2019/046176 filed on Nov. 26, 2019 which claims priority from Japanese Patent Application No. 2018-221450 filed on Nov. 27, 2018. The contents of these applications are incorporated herein by reference in their entireties.

BACKGROUND

Technical Field

The present disclosure relates to a pump and particularly relates to a pump that includes a piezoelectric body.

Heretofore, pumps that include piezoelectric bodies have been used as suction devices or pressurization devices for fluids, such as gases and liquids. Among such pumps, there are pumps in which the function of a valve body, which closes an intake port or a discharge port to or from the pump chamber, is at least partially realized by vibration of a vibrating plate.

For example, Patent Document 1 discloses a pump that does not include a valve body. The pump carries out suction and discharging by vibrating the vibrating plate to which a piezoelectric body is adhered.

Patent Document 1: Japanese Patent No. 5177331

BRIEF SUMMARY

However, in pumps in which the function of a valve body is at least partially realized by the vibration of a vibrating plate, there is a problem in that backflow of the fluid from the intake and discharge ports into the pump chamber occurs in accordance with pressure changes in the pump chamber and the pump flow rate and the pump pressure are reduced.

Therefore, the present disclosure provides a pump having reduced backflow of a fluid for a pump driven using a piezoelectric body.

A pump according to an aspect of the present disclosure includes:
- a vibrating plate having a piezoelectric body connected to a first main surface thereof;
- a cover including a top plate that faces a second main surface of the vibrating plate, which is on the opposite side from the first main surface, and that has an opening part, and a side wall that is connected to an outer peripheral portion of the top plate so as to surround a space between the top plate and the vibrating plate;
- a support portion that is connected to the side wall and supports an outer periphery of the vibrating plate;
- an opening that is formed between the side wall and the vibrating plate; and
- a protrusion that is provided on any one out of the top plate, the side wall, and the vibrating plate so as to protrude into the space.

The protrusion is provided between the opening part of the top plate and the side wall in a cross section viewed in a direction perpendicular to a direction in which a main surface of the top plate and the second main surface of the vibrating plate face each other.

With the pump according to the present disclosure, there can be provided a pump that has reduced backflow of a fluid for a pump driven using a piezoelectric body.

DETAILED DESCRIPTION

Figure 1:
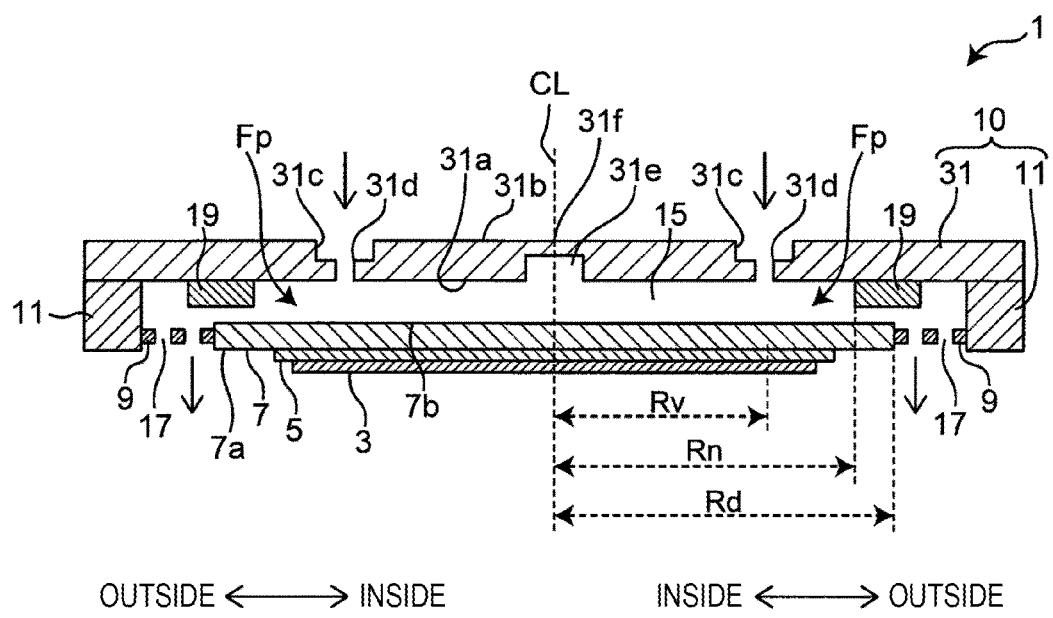
FIG. 1 is a schematic sectional view of a pump of embodiment 1.

A pump according to an aspect of the present disclosure includes: a vibrating plate having a piezoelectric body connected to a first main surface thereof; a cover including a top plate that faces a second main surface of the vibrating plate, which is on the opposite side from the first main surface, and that has an opening part, and a side wall that is connected to an outer peripheral portion of the top plate so as to surround a space between the top plate and the vibrating plate; a support portion that is connected to the side wall and supports an outer periphery of the vibrating plate; an opening that is formed between the side wall and the vibrating plate; and a protrusion that is provided on any one out of the top plate, the side wall, and the vibrating plate so as to protrude into the space. The protrusion is provided between the opening part of the top plate and the side wall in a cross section viewed in a direction perpendicular to a direction in which a main surface of the top plate and the second main surface of the vibrating plate face each other.

With this configuration, backflow of a fluid into the space enclosed by the top plate, the side wall, and the vibrating plate can be suppressed by the protrusion and a large pump flow rate and a large pump pressure can be obtained.

In addition, the vibrating plate may have a circular plate shape. With this configuration, a bending vibration is generated in the form of concentric circles from the center of the main surface towards the outer periphery.

Furthermore, the support portion may have a beam shape that extends along an outer peripheral edge of the vibrating plate. With this configuration, displacement of the outer peripheral edge of the vibrating plate is further increased, and therefore the backflow suppression effect can be increased and the pump flow rate and the pump pressure can be increased.

Furthermore, the support portion may include a beam portion, a first connecting portion that connects the vibrating plate and the beam portion to each other, and a second connecting portion that connects the side wall and the beam portion to each other, a plurality, namely, three or more of the support portions may be provided, and the support portions may be provided so as to be spaced apart from each other. As a result of three or more of the support portions being provided and the support portions being provided so as to be spaced apart from each other, the vibrating plate can be properly supported while vibrating.

In addition, an average thickness of the support portion may be smaller than an average thickness of the vibrating plate. Furthermore, a Young's modulus of the support portion may be lower than a Young's modulus of the vibrating plate. With this configuration, the support portion can be made more flexible than the vibrating plate.

In addition, the protrusion may be provided on the top plate or the side wall. With this configuration, since the protrusion is not connected to the vibrating plate or the support portion, vibration of the vibrating plate does not leak to the protrusion and vibration of the protrusion is small, and therefore loss of vibrational energy is small.

Furthermore, a shortest distance between the protrusion and the vibrating plate may be smaller than an average interval between the vibrating plate and the top plate. With this configuration, the fluid backflow suppression effect can be increased, and therefore the pump flow rate and the pump pressure can be increased.

In addition, the protrusion and the vibrating plate may face each other. With this configuration, the fluid backflow suppression effect can be increased, and therefore the pump pressure can be increased.

In addition, the top plate may have a point symmetrical shape having a symmetry point and the opening part may not be located at the symmetry point and the opening part of the top plate may be formed in a ring shape. With this configuration, vibrational displacement is large at the center of the pump chamber and therefore pressure variations are also large at the center of the pump chamber. The symmetry point of the top plate is located at the center of the pump chamber and covers the region in the center of the pump chamber, and therefore pressure variations inside the pump chamber are high and a large pump flow rate and a large pump pressure can be obtained.

Furthermore, the top plate and a surface of the protrusion that faces the top plate may be connected to each other. With this configuration, turbulence of airflow near the protrusion is small and flow loss is small.

Furthermore, a recess may be provided outside the opening part of the top plate. With this configuration, air resistance of the opening part can be reduced without necessarily disturbing air flow inside the opening part.

In addition, a depression may be provided on a side of the top plate near the vibrating plate at a point nearer a center of the vibrating plate than a node of the vibrating plate. With this configuration, the interval between the vibrating plate and the top plate is larger at the center of the vibrating plate, where the vibrational displacement is maximum, than at other locations, and therefore air resistance is reduced and vibrational displacement is increased. As a result, the pump flow rate and the pump pressure are increased.

In addition, a valve formed of a film-like member may be provided outside the opening part in a space between the vibrating plate and the top plate. With this configuration, the backflow suppression effect is high and therefore a high pump pressure can be obtained.

In addition, the valve may have a function of restricting fluid in a direction from the opening formed between the side wall and the vibrating plate toward the opening part of the top plate. With this configuration, the fluid backflow suppression effect achieved by the protrusion can be further increased, and therefore the pump pressure can be further increased.

In addition, an inner side of the valve may be fixed to the vibrating plate or the top plate and the valve may have a movable portion formed of a movable film on an outer side thereof. This configuration enables fluid flowing from the vibrating plate side toward the top plate side to be restricted.

In addition, the movable portion of the valve may have a part that faces the protrusion.

Furthermore, an outer end of the movable portion of the valve may face the protrusion.

Hereafter, pumps according to the present disclosure will be described while referring to the drawings. In the drawings, members having substantially the same functions and configurations are denoted by the same symbols and description thereof may be omitted in this specification. In addition, for ease of understanding, the individual constituent elements are mainly illustrated in a schematic manner.

The embodiments described hereafter, each describes a specific example of the present disclosure, and the present disclosure is not limited to these configurations. In addition, the numerical values, shapes, configurations, steps, the order of the steps, and so forth specifically described in the following embodiments are merely examples and do not limit the present disclosure. Constituent elements not described in the independent claims that describe the most generic concepts of the present disclosure among constituent elements in the following embodiments are described as arbitrary constituent elements. In addition, this also similarly applies to the configurations of modifications of all the embodiments and the configurations described in the individual modifications may be combined with each other.

Embodiment 1

First, referring to FIG. 1, the structure of a pump 1 of embodiment 1 will be described in a schematic manner. FIG. 1 is a schematic sectional view of the pump 1 of embodiment 1. Note that, in the following description, air is described as an example of a fluid made to flow by the pump 1, but the fluid is not limited to air and alternatively may be a gas other than air or a liquid.

The pump 1 includes a piezoelectric body 3, an auxiliary plate 5, a vibrating plate 7, support portions 9 that support the vibrating plate 7 so that the vibrating plate 7 is able to vibrate, and a cover 10 that surrounds a space between the cover 10 and the vibrating plate 7.

The cover 10 includes a side wall 11 to which outer edges of the support portions 9 are connected and a top plate 31 that is connected to an upper end of the side wall 11.

The piezoelectric body 3 is formed by providing electrodes on both main surfaces of a thin plate composed of a piezoelectric material. Electrode films, which are not illustrated, are provided over substantially the entire upper and lower main surfaces of the piezoelectric body 3. The piezoelectric body 3 is shaped like a circular plate and is adhered to a lower surface of a center portion of the auxiliary plate 5.

The auxiliary plate 5 is arranged between the piezoelectric body 3 and the vibrating plate 7. The upper surface of the auxiliary plate 5 is adhered to the lower surface of a center portion of the vibrating plate 7. The pump 1 may instead have a configuration that does not include the auxiliary plate 5 and in which the piezoelectric body 3 is adhered to the lower surface of a center portion of the vibrating plate 7.

The vibrating plate 7 is, for example, composed of a metal, such as SUS301. The piezoelectric body 3 is connected to a first main surface 7a of the vibrating plate 7 via the auxiliary plate 5. For example, a square wave or sinusoidal wave driving voltage of around 20 kHz is applied between the electrode films on the upper and lower main surfaces of the piezoelectric body 3 from an external power source. In addition, since the vibrating plate 7 is shaped like a circular plate, bending vibration having an amplitude in a direction normal to the main surfaces is generated in the vibrating plate 7, the auxiliary plate 5, and the piezoelectric body 3 in a rotationally symmetrical shape (concentric circles) from the center to the outer periphery of the main surfaces.

The vibrating plate 7 faces the top plate 31 with a fixed distance therebetween. The space between a second main surface 7b, which is on the opposite side from the first main surface 7a, of the vibrating plate 7 and the top plate 31 forms a pump chamber 15. The support portions 9 connect the vibrating plate 7 to the side wall 11 so that the outer peripheral edge of the vibrating plate 7 can vibrate.

The top plate 31 has a first main surface 31a that faces the vibrating plate 7, a second main surface 31b on the opposite side from the first main surface 31a, a ring-shaped recess 31c formed on the second main surface 31b side, and a plurality of opening parts 31d that penetrate from a bottom surface of the recess 31c to the pump chamber 15 and are arrayed in a ring shape. In addition, the top plate 31 includes a ring-shaped depression 31e in a center portion of the first main surface 31a side that is depressed toward the second main surface. The top plate 31 has a point symmetrical shape having a symmetry point 31f and the opening parts 31d are not located at the symmetry point 31f. The symmetry point 31f is at a position on the top plate 31 that faces a center CL of the vibrating plate 7, for example, the center of the top plate 31. FIG. 1 is a sectional view looking in a direction perpendicular to a direction which the first main surface 31a of the top plate 31 and the second main surface 7b of the vibrating plate 7 face each other.

The side wall 11 is connected to an outer peripheral portion of the top plate 31 so as to surround the pump chamber 15 on the side of the top plate 31 near the vibrating plate 7. The side wall 11 has, for example, a cylindrical shape. Therefore, the cover 10 faces the surface of the vibrating plate 7 on the opposite side from the first main surface 31a, has the opening parts 31d, and is connected to the outer peripheral portion of the vibrating plate 7 via the support portions 9. The top plate 31 and the side wall 11 may form the cover 10 as separate members or may form the cover 10 as an integrated component.

There is an opening 17, which allows the pump chamber 15 and the external space on the side near the piezoelectric body 3 to communicate with each other, between the vibrating plate 7 and the side wall 11. As a result, air sucked into the pump chamber 15 from the opening parts 31d of the top plate 31 is discharged from the opening 17.

The pump 1 further includes, inside the pump chamber 15, a protrusion 19 that reduces the flow path cross-sectional area of a flow path Fp from the opening parts 31d of the top plate 31 to the opening 17. The protrusion 19, for example, protrudes in a ring-like shape from the first main surface 31a of the top plate 31 toward the vibrating plate 7. The protrusion 19 is formed all the way around from the first main surface 31a of the top plate 31. A plurality of protrusions 19 may be provided in a ring-like shape with gaps therebetween that are smaller than or equal to the interval between the vibrating plate 7 and the top plate 31.

The protrusion 19 is provided radially outside the opening parts 31d of the top plate 31. In addition, the protrusion 19 is arranged outside the outer peripheral edge of the piezoelectric body 3. In the interval between the vibrating plate 7 and the top plate 31, the average interval outside the piezoelectric body 3 is smaller than the interval at the outer peripheral portion of the piezoelectric body 3. As a result, the thickness is smaller and the displacement is larger outside the piezoelectric body 3 in the radial direction, and therefore the increase or decrease in the flow path resistance is larger and the effect of straightening the flow of air through the pump chamber 15 is larger.

The relationship between a radius Rd of the vibrating plate 7, a distance Rn from the center CL of the pump 1 and the vibrating plate 7 to the protrusion 19, and a distance Rv from the center CL of the vibrating plate 7 to a node of the vibrating plate 7 during vibration is described below. The distance Rn extends radially to outside the distance Rv. The distance Rv lies in a range from 55% to 71% of the radius Rd, and generally is 63% of the radius Rd. The flow path Fp is narrowed at a place where the vibrating plate 7 is displaced and an effect of straightening the flow of air can be obtained as a result of the protrusion 19 being located outside the node of the vibrating plate 7.

The opening parts 31d of the top plate 31 are formed in a range from 45% to 81% of the radius Rd from the center CL of the pump chamber 15. The pressure distribution inside the pump chamber 15 follows a Bessel function of the first kind and therefore the region in this range is close to a node of the pressure distribution. Therefore, a high pump flow rate and a high pump pressure can be obtained without necessarily fluid leakage from the opening parts 31d.

Furthermore, when the distance Rn is greater than or equal to 90% of the radius Rd, a relationship is satisfied in which the average interval at the distance Rn from the distance Rv (node) is smaller than the average interval between the vibrating plate 7 and the top plate 31 outside the radius Rd. In this case, since the flow path is narrowed at a place where displacement of the vibrating plate 7 is large close to a second antinode, the effect of straightening the airflow can be increased.

Figure 2A:
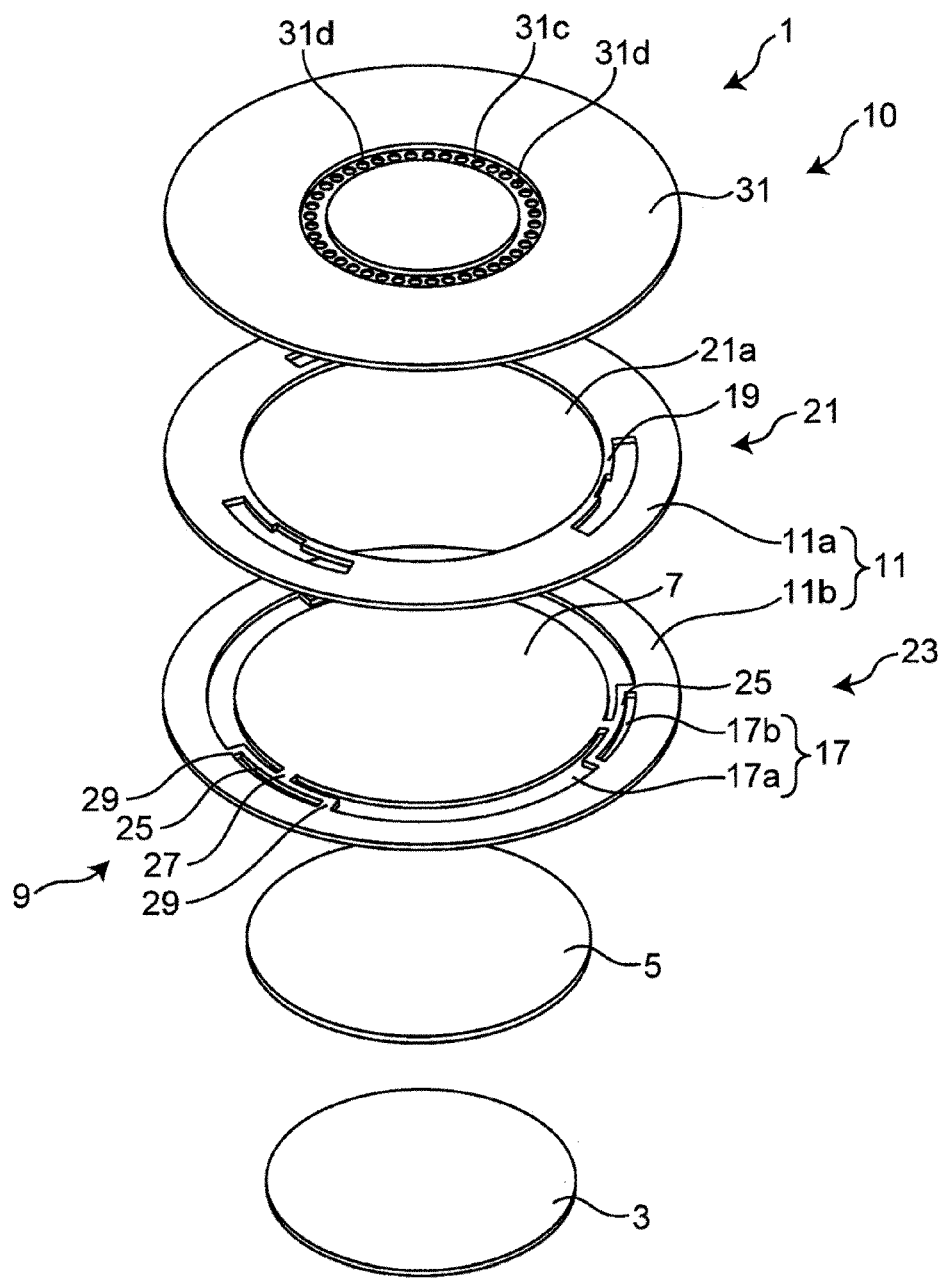
FIG. 2A is an exploded perspective view of the pump seen from a top plate side.
Figure 2B:
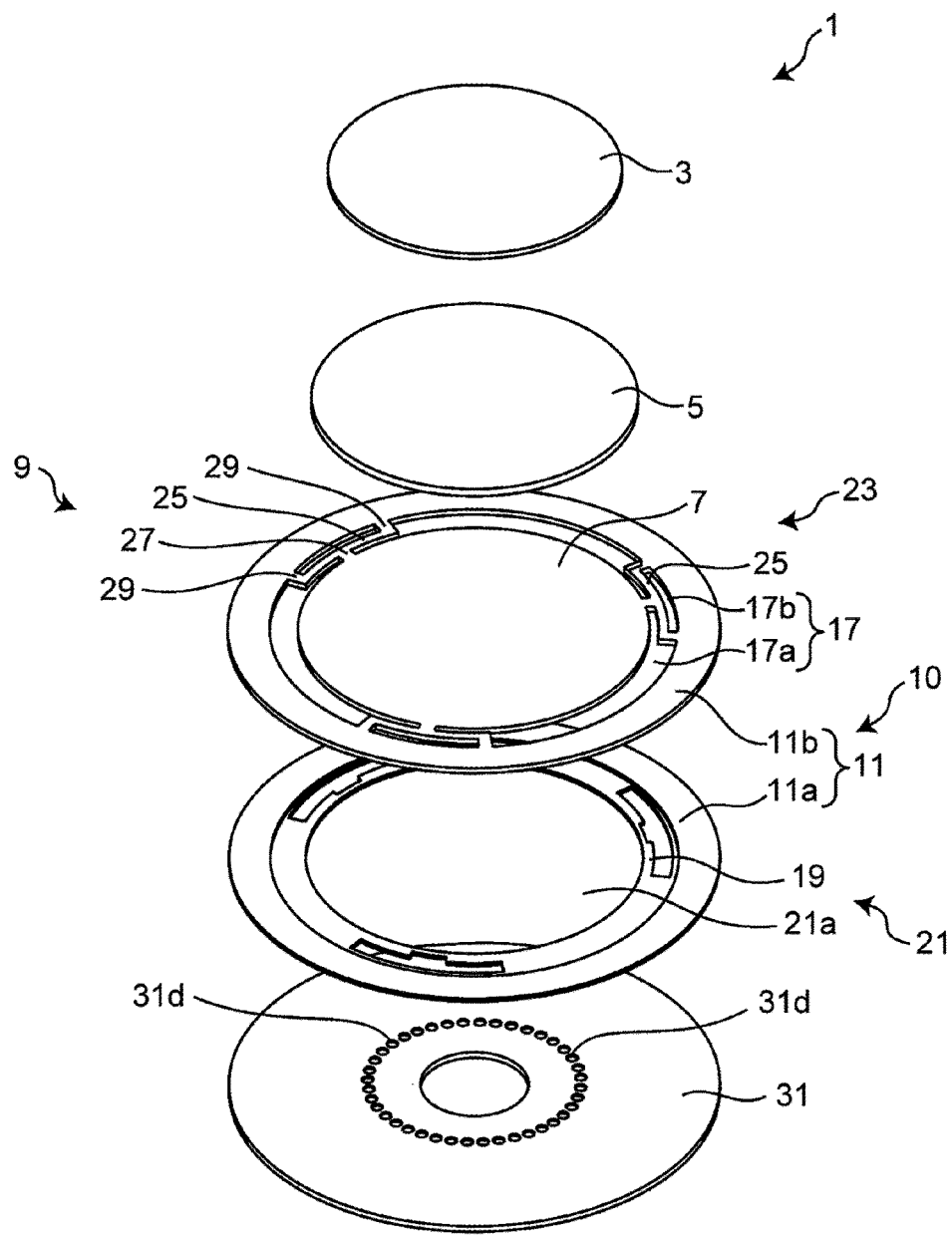
FIG. 2B is an exploded perspective view of the pump seen from a piezoelectric body side.
Figure 3A:
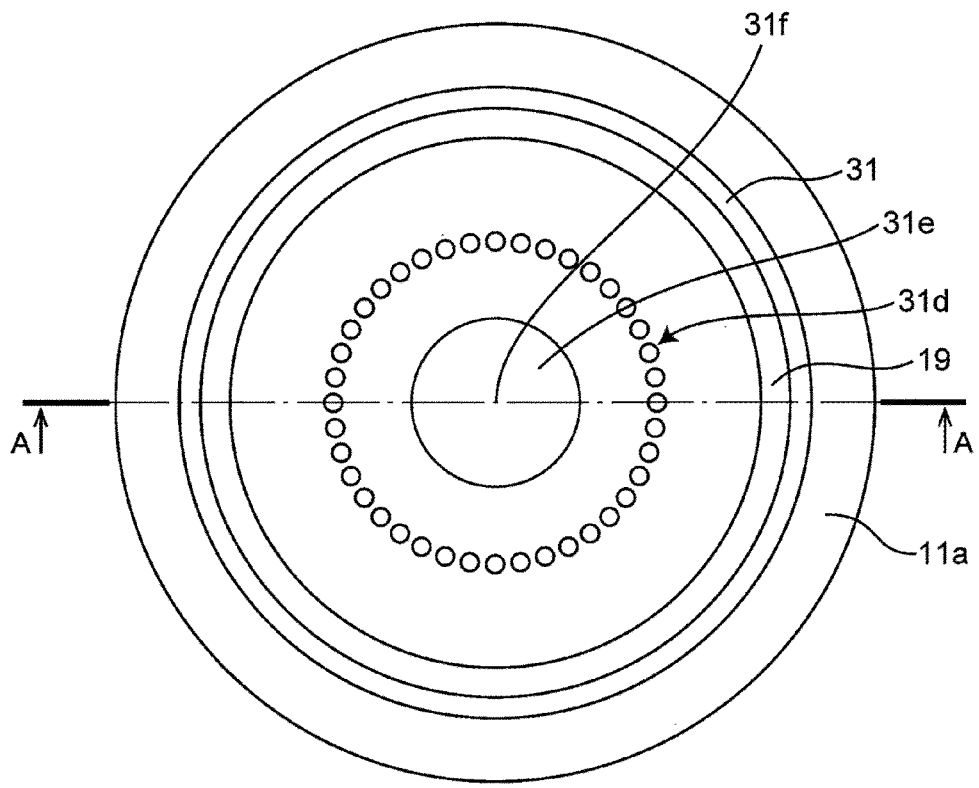
FIG. 3A is a bottom view of the pump of embodiment 1.
Figure 3B:
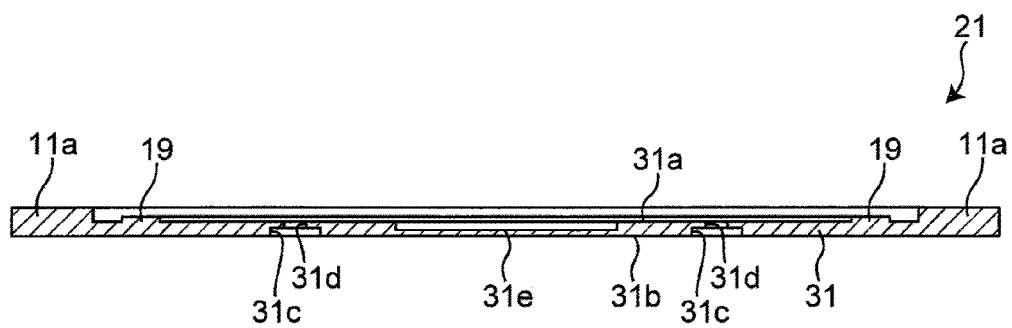
FIG. 3B is a sectional view taken along line A-A in FIG. 3A.
Figure 4:
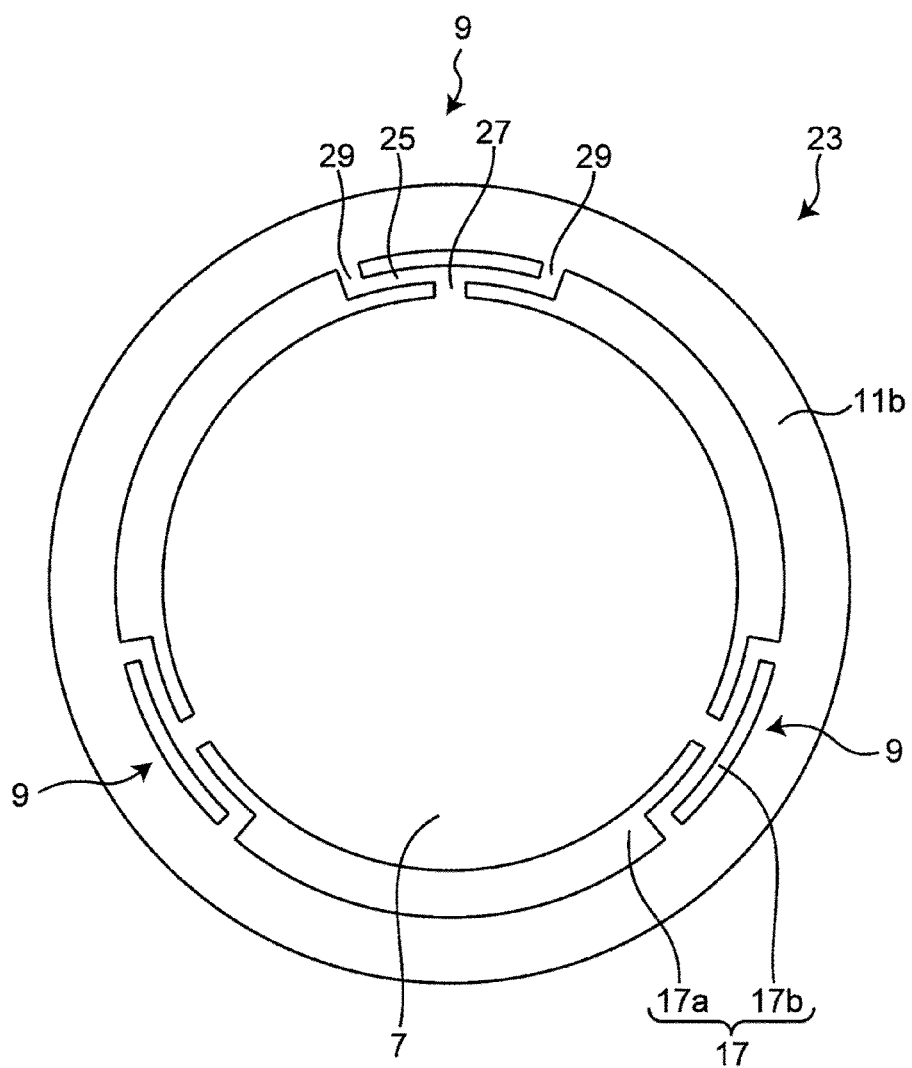
FIG. 4 is a plan view of a vibrating unit.

Next, a specific example configuration of the pump 1 of embodiment 1 will be described in detail while referring to FIGS. 2A to 4. FIG. 2A is an exploded perspective view of the pump 1 seen from the top plate 31 side. FIG. 2B is an exploded perspective view of the pump 1 seen from the piezoelectric body 3 side. FIG. 3A is a plan view of the top plate 31 and the side wall 11 seen from the vibrating plate side. FIG. 3B is a sectional view taken along line A-A in FIG. 3A. FIG. 4 is a plan view of a vibrating unit 23.

The pump 1 is formed by sequentially stacking a plurality of plate-shaped members consisting of the piezoelectric body 3, the auxiliary plate 5, the vibrating unit 23, a side wall plate 21, and the top plate 31. The pump 1 is configured to have a low profile with a total thickness of around 1 mm, for example.

The side wall plate 21 includes a circular opening 21a that forms the pump chamber 15 and a side wall portion 11a that surrounds the periphery of the opening 21a.

The vibrating unit 23 includes the vibrating plate 7, the support portions 9, a side wall portion 11b, and the opening 17. The vibrating plate 7, for example, has a circular plate shape in a plan view and is arranged at the center of the vibrating unit 23. The side wall portion 11b has a frame-like shape in a plan view and is arranged around the periphery of the vibrating plate 7. The support portions 9, each includes a beam-shaped beam portion 25 that extends along the outer peripheral edge of the vibrating plate 7 and connects the vibrating plate 7 and the side wall portion 11b to each other. The vibrating plate 7 is arranged so that the center thereof faces the depression 31e of the top plate 31. The vibrating plate 7 is thicker than the support portions 9. The side wall portion 11a of the side wall plate 21 and the side wall portion 11b of the vibrating unit 23 form the side wall 11.

A plurality, namely, three or more of the support portions 9 are provided in the vibrating unit 23 and the support portions 9 are provided so as to be spaced apart from each other. The support portions 9, each includes a beam-shaped beam portion 25, a first connecting portion 27 that extend in a radial direction of the vibrating plate 7 and connect the beam portion 25 and the vibrating plate 7 to each other, and second connecting portions 29 that extend in a radial direction of the vibrating plate 7 and connect the beam portion 25 and the side wall portion 11b to each other. The first connecting portions 27 are arranged at intervals of 120°. Since the support portions 9 include the long beam portions 25, the support portions 9 are formed in a shape so as to be more flexible than the vibrating plate 7 and the outer peripheral edge of the vibrating plate 7 is able to vibrate. The average thickness of the support portions 9 may be smaller than the average thickness of the vibrating plate 7 or the support portions 9 may be formed of a material that bends more easily than the vibrating plate 7 in order to make the support portions 9 more flexible than the vibrating plate 7. Furthermore, the Young's modulus of the support portions 9 may be lower than the Young's modulus of the vibrating plate 7.

The opening 17 includes first openings 17a that are formed between the vibrating plate 7 and the side wall portion 11b and second openings 17b that are formed between the beam portions 25 and the side wall portion 11b. The first openings 17a are formed along the outer peripheral edge of the vibrating plate 7. The second openings 17b are formed along the beam portions 25. In the vibrating unit 23, the first openings 17a and the second openings 17b both penetrate in the stacking direction.

The vibrating plate 7, for example, has a diameter of 13 mm and a thickness of 0.5 mm. The piezoelectric body 3, for example, has a diameter of 11 mm and a thickness of 0.05 mm. The top plate 31, for example, has a diameter of 17 mm and a thickness of 0.25 mm. The interval between the vibrating plate 7 and the top plate 31 in the center portion is, for example, 0.15 mm. The protrusion 19 has an inner diameter of 12 mm and a thickness of 0.12 mm.

Next, driving of the pump 1 will be described while referring to FIGS. 5A to 5H. FIGS. 5A to 5H are explanatory views illustrating displacement of the vibrating plate during operation of the pump 1. In the pump 1, when an AC driving voltage is applied to external connection terminals, the piezoelectric body 3 attempts to expand and contract isotropically in in-plane directions and a bending vibration in the thickness direction is generated in a concentric manner in the multilayer body consisting of the piezoelectric body 3 and the vibrating plate 7. In this bending vibration, the side wall portion 11b acts as a fixed portion, the center of the vibrating plate 7 becomes an antinode of a first vibration, and the outer peripheral edge of the vibrating plate 7 becomes an antinode of a second vibration. The center of the vibrating plate 7 and the outer peripheral edge of the vibrating plate 7 vibrate in opposite directions.

Figure 5A:
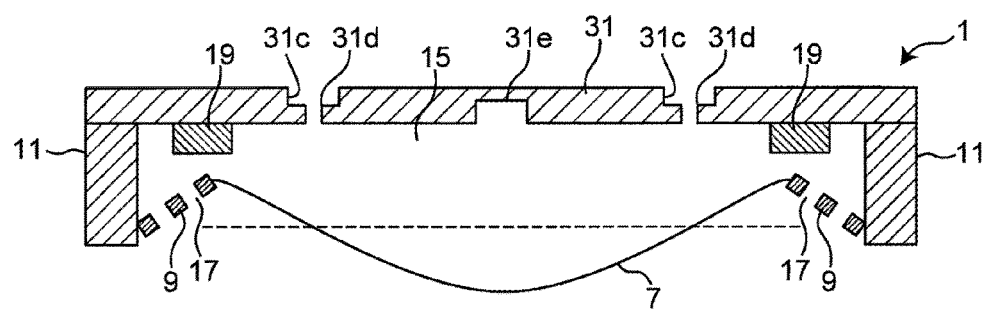
FIG. 5A is an explanatory view illustrating displacement of a vibrating plate during operation of the pump.
Figure 5B:
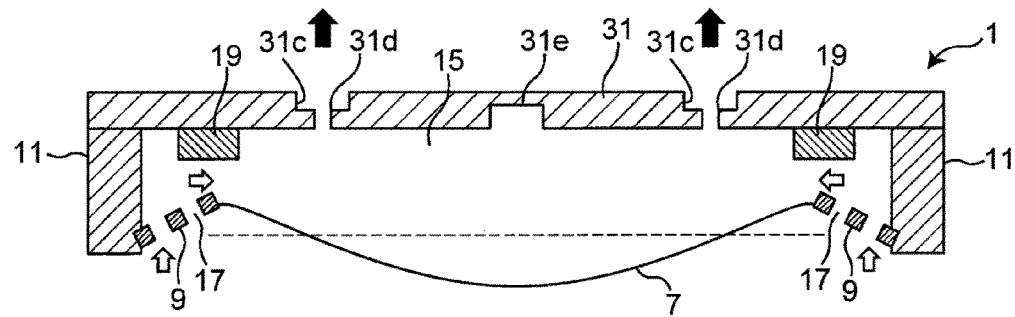
FIG. 5B is an explanatory view illustrating displacement of the vibrating plate during operation of the pump.
Figure 5C:
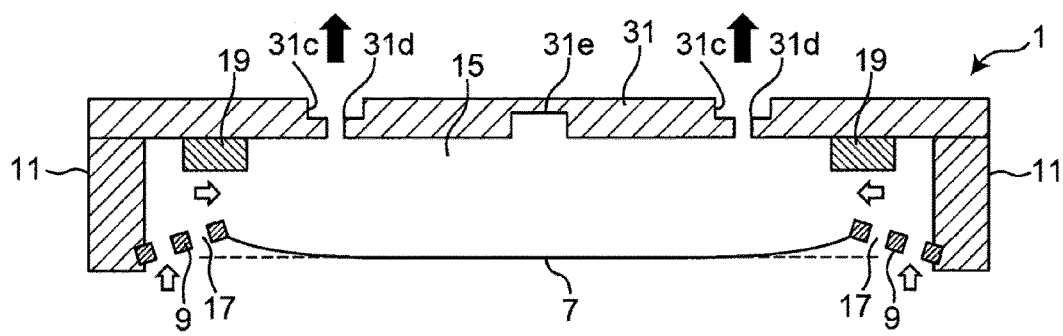
FIG. 5C is an explanatory view illustrating displacement of the vibrating plate during operation of the pump.
Figure 5D:
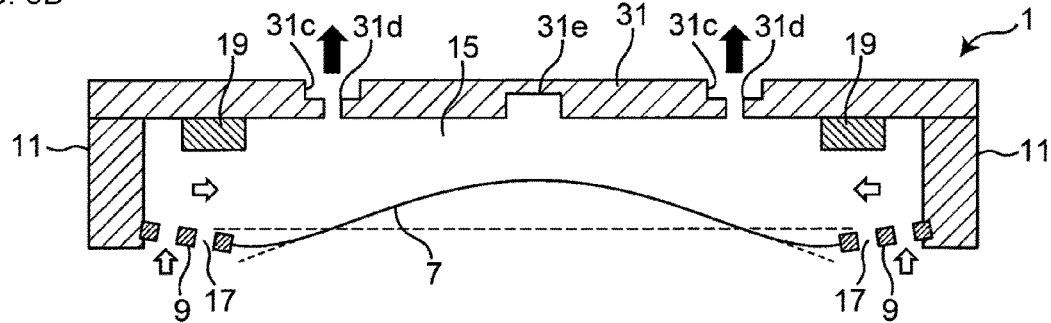
FIG. 5D is an explanatory view illustrating displacement of the vibrating plate during operation of the pump.

FIG. 5A illustrates a state in which the center of the vibrating plate 7 is furthest from the top plate 31. In this state, the outer peripheral edge of the vibrating plate 7 is close to the top plate 31. Next, as illustrated in FIG. 5B, when the center of the vibrating plate 7 moves a little closer to the top plate 31, the outer peripheral side of the vibrating plate 7 beyond the node of the vibrating plate 7 moves away from the top plate 31 and as a result, an airflow from the outside toward the center is generated at the outer peripheral edge of the vibrating plate 7. FIGS. 5C and 5D illustrate a similar situation.

Figure 5E:
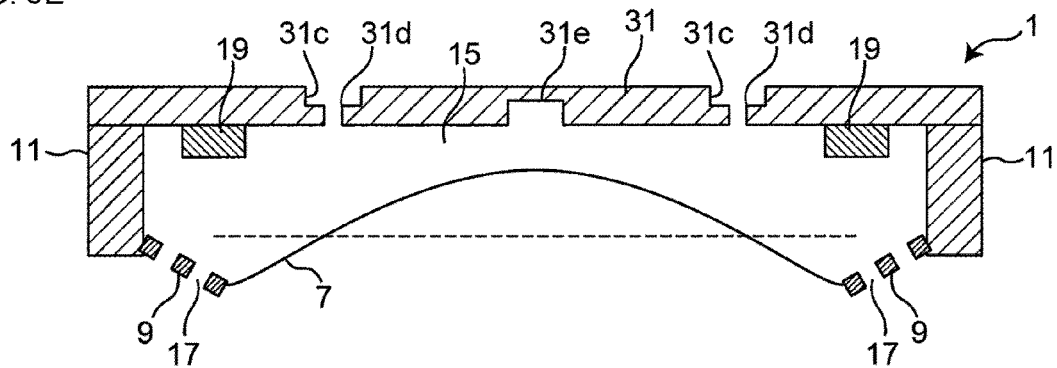
FIG. 5E is an explanatory view illustrating displacement of the vibrating plate during operation of the pump.

Eventually, as illustrated in FIG. 5E, a state is reached where the center of the vibrating plate 7 is closest to the top plate 31. In this state, the outer peripheral edge of the vibrating plate 7 is spaced away from the top plate 31.

Figure 5F:
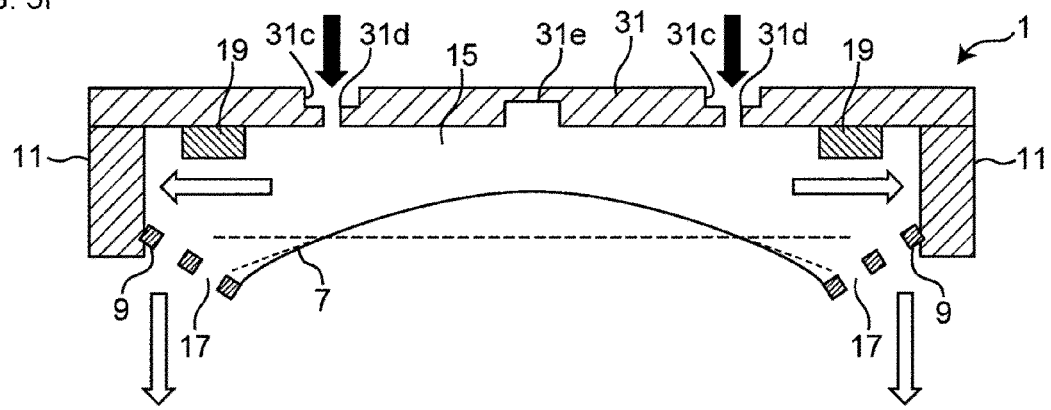
FIG. 5F is an explanatory view illustrating displacement of the vibrating plate during operation of the pump.

Next, as illustrated in FIG. 5F, when the center of the vibrating plate 7 begins to move away from being maximally close to the top plate 31, the outer peripheral side of the vibrating plate 7 beyond the node of the vibrating plate 7 moves closer to the top plate 31 and as a result an airflow from the center toward the outside is generated at the outer peripheral edge of the vibrating plate 7. A similar situation is illustrated in FIGS. 5G and 5H.

Here, the support portions 9 have a shape having high flexibility, and therefore the outer peripheral edge of the vibrating plate 7 is easily affected by air resistance. Therefore, in the process illustrated in FIGS. 5A to 5H, the displacement of the outer peripheral edge of the vibrating plate 7 is retarded by the air resistance. Therefore, the outer peripheral edge of the vibrating plate 7 is closer to the top plate 31 in the states in FIGS. 5B, 5C, and 5D than in the states in FIGS. 5G, 5F, and 5E. Therefore, the flow path at the outer peripheral edge of the vibrating plate 7 is narrower and consequently the flow path resistance is higher in the states in FIGS. 5B, 5C, and 5D than in the states in FIGS. 5G, 5F, and 5E. As a result, air flow from the outside toward the center of the vibrating plate 7 in the states in FIGS. 5B, 5C, and 5D is smaller than the air flow from the center of the vibrating plate 7 toward the outside in the states in FIGS. 5G, 5F, and 5E. Therefore, in a cycle that transitions from FIG. 5A to FIG. 5H and then back to FIG. 5A, airflow is generated from the center of the vibrating plate 7 toward the outside and airflow is generated from the opening parts 31$d$ of the top plate 31 to the opening 17.

Figure 5G:
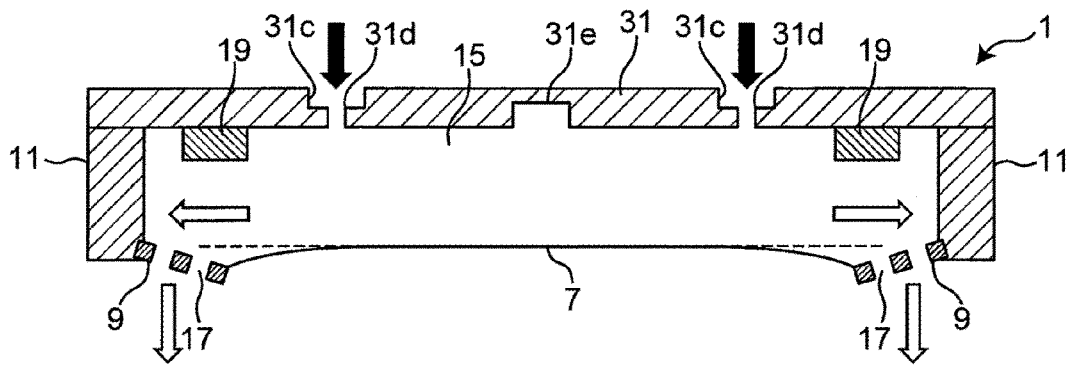
FIG. 5G is an explanatory view illustrating displacement of the vibrating plate during operation of the pump.

Next, as illustrated in FIG. 5G, even when the center of the vibrating plate 7 is further away from the top plate 31 and the center portion of the vibrating plate 7 is roughly parallel to the top plate 31, the outer peripheral edge of the vibrating plate 7 is still curved in a direction away from the top plate 31. At this time, the inside of the pump chamber 15 has a positive pressure that is smaller than that in the state in FIG. 5F.

Figure 5H:
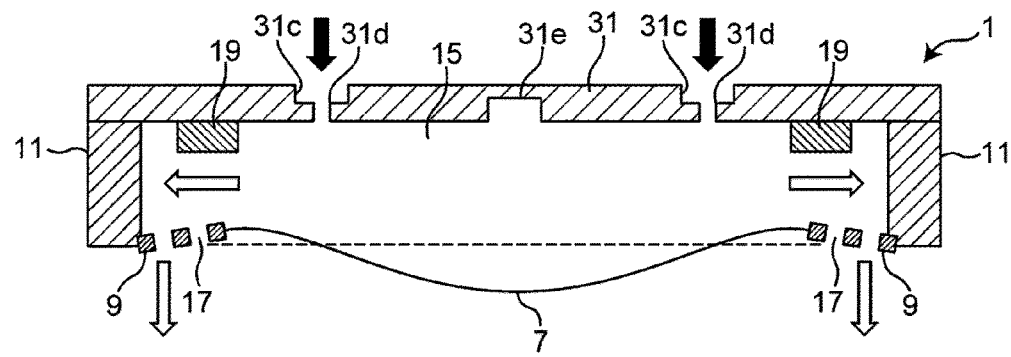
FIG. 5H is an explanatory view illustrating displacement of the vibrating plate during operation of the pump.

As illustrated in FIG. 5H, when the center of the vibrating plate 7 is further separated from the top plate 31, the inside of the pump chamber 15 is at a positive pressure that is even smaller than that in the state in FIG. 5G. The displacement of the outer peripheral edge of the vibrating plate 7 is slower than the displacement of the center of the vibrating plate 7, and therefore the outer peripheral edge of the vibrating plate 7 is curved down from the top plate 31. After that, the pump 1 transitions again to the state illustrated in FIG. 5A. Thus, the pump 1 sequentially transitions from the state illustrated in FIG. 5A to the state illustrated in FIG. 5H and pump operation is realized.

According to the pump 1 of embodiment 1, the support portions 9 may have higher flexibility than the vibrating plate 7. With this configuration, displacement of the outer peripheral edge of the vibrating plate 7 is increased, and therefore backflow can be further suppressed and the pump flow rate and the pump pressure can be increased.

In addition, the support portions 9 have a beam shape that extends along the outer peripheral edge of the vibrating plate 7. With this configuration, displacement of the outer peripheral edge of the vibrating plate 7 is further increased, and therefore the fluid backflow suppression effect can be increased and the pump flow rate and the pump pressure can be increased.

In addition, the support portions 9, each includes the beam portion 25, the first connecting portion 27 that connects the vibrating plate 7 and the beam portion 25, and the second connecting portions 29 that connect the side wall 11 and the beam portion 25, and a plurality, namely, three or more of the support portions 9 are provided and the support portions 9 are provided so as to be spaced apart from each other. With this configuration, the vibrating plate 7 can be properly supported while vibrating.

In addition, the protrusion 19 and the vibrating plate 7 face each other. With this configuration, the fluid backflow suppression effect can be increased, and therefore the pump pressure can be increased.

Furthermore, the top plate 31 has a point symmetrical shape having the symmetry point 31$f$, the opening parts 31$d$ are not located at the symmetry point 31$f$, and the opening parts 31$d$ of the top plate 31 are formed in a ring shape. With this configuration, vibrational displacement is large at the center of the pump chamber 15 and therefore pressure variations are also large at the center of the pump chamber 15. Since the center of the top plate 31, which is the symmetry point 31$f$, is closed and the center of the top plate 31 covers the region where pressure variations are large, the pressure variations inside the pump chamber 15 are increased and a large pump flow rate and large pump pressure can be obtained.

Furthermore, the surface of the protrusion 19 that faces the top plate 31 and the top plate 31 are connected to each other. With this configuration, turbulence of airflow near the protrusion 19 is small and flow loss is small.

Furthermore, the recess 31$c$ is provided outside of the opening parts 31$d$ of the top plate 31. With this configuration, the air resistance of the opening parts 31$d$ can be reduced without necessarily disturbing the air flow inside the opening parts 31$d$.

Furthermore, the depression 31$e$ is provided on the inner main surface of the top plate 31 nearer to the center than the node of the vibrating plate 7 during vibration. With this configuration, the interval between the vibrating plate 7 and the top plate 31 is large at the center portion of the vibrating plate 7 where the vibrational displacement is largest, and therefore air resistance is reduced and vibrational displacement is increased. As a result, the pump flow rate and the pump pressure are increased.

Embodiment 2

Figure 6:
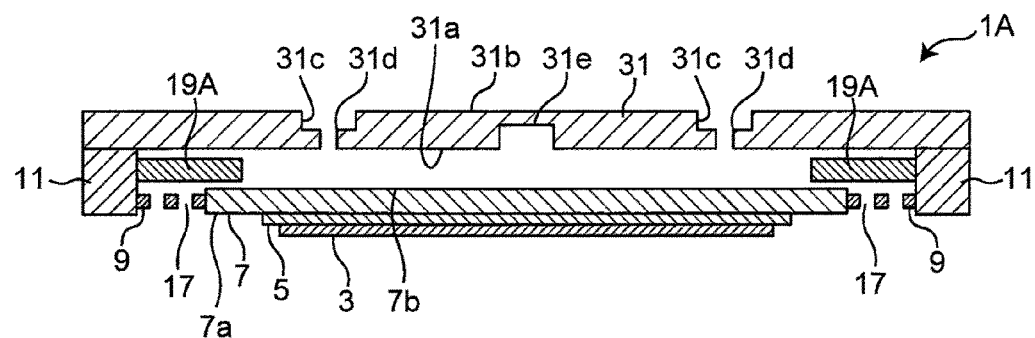
FIG. 6 is a schematic sectional view of a pump of embodiment 2.
Figure 7:
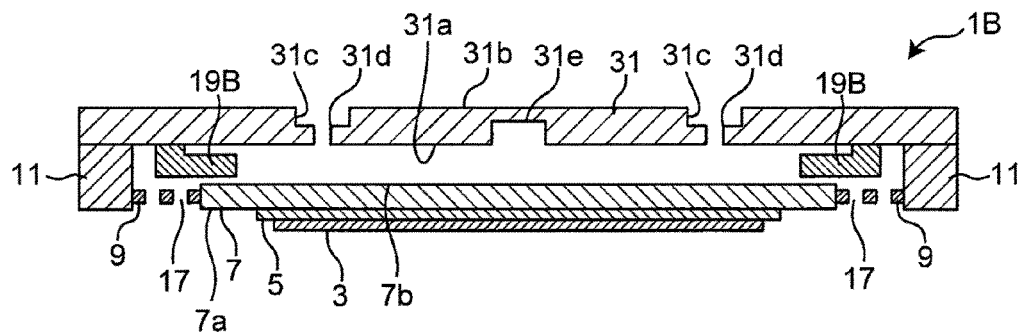
FIG. 7 is a schematic sectional view of a pump of a modification of embodiment 2.

Next, pumps 1A and 1B of embodiment 2 of the present disclosure will be described while referring to FIGS. 6 and 7. FIG. 6 is a schematic sectional view of the pump 1A of embodiment 2. FIG. 7 is a schematic sectional view of the pump 1B of a modification of embodiment 2.

In the pump 1A of embodiment 2, the protrusion 19 is connected to the top plate 31 or the side wall 11 outside the vibrating plate 7. The pump 1 of embodiment 1 and the pump 1A of embodiment 2 differ with respect to this point. Therefore, other than this point, the rest of the configuration of the pump 1A of embodiment 2 is the same as that of the pump 1 of embodiment 1.

As illustrated in FIG. 6, a protrusion 19A of the pump 1A extends from the side wall 11 between the top plate 31 and the vibrating plate 7. Furthermore, as illustrated in FIG. 7, a protrusion 19B of the pump 1B is L-shaped and is connected to the top plate 31 outside the vibrating plate 7.

As described above, backflow into the pump chamber 15 can be prevented with the configurations of embodiment 2 and a modification of embodiment 2. In addition, since the protrusions 19A and 19B are not connected to the vibrating plate 7 or the support portions 9, the vibration of the vibrating plate 7 does not leak to the protrusions 19A and 19B and loss of vibration energy can be reduced.

Embodiment 3

Figure 8:
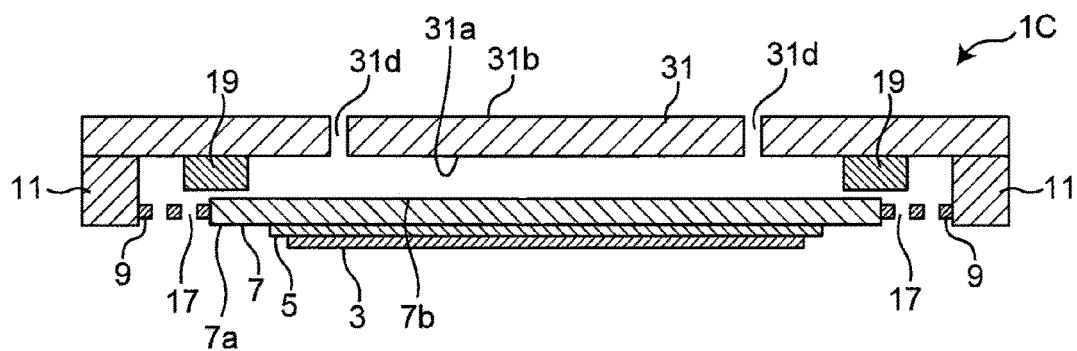
FIG. 8 is a schematic sectional view of a pump of embodiment 3.

Next, a pump 1B of embodiment 3 of the present disclosure will be described while referring to FIG. 8. FIG. 8 is a schematic sectional view of the pump 1C of embodiment 3.

In the pump 1C of embodiment 3, the recess 31$c$ and the depression 31$e$ are not provided in the top plate 31. The pump 1 of embodiment 1 and a pump 1C of embodiment 3 differ in terms of this point. Other than this point, the configurations of the pump 1 of embodiment 1 and the pump 1C of embodiment 3 are identical.

Thus, backflow of fluid into the pump chamber 15 can also be prevented by the pump 1C of embodiment 3.

Embodiment 4

Figure 9:
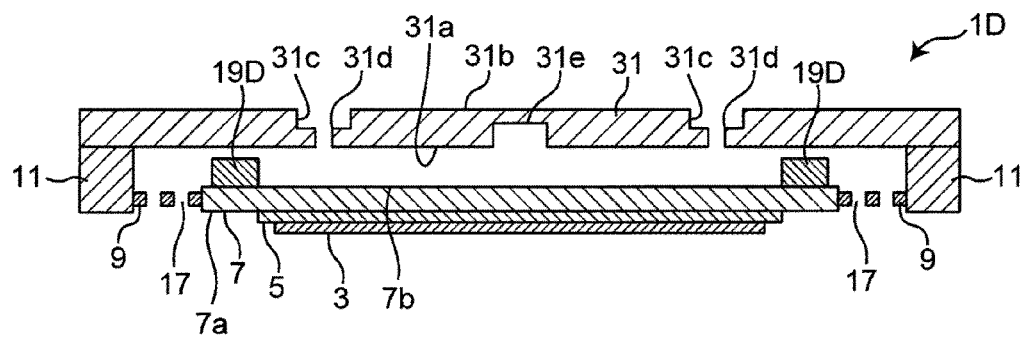
FIG. 9 is a schematic sectional view of a pump of embodiment 4.

Next, a pump 1D of embodiment 4 of the present disclosure will be described while referring to FIG. 9. FIG. 9 is a schematic sectional view of the pump 1D of embodiment 4.

A protrusion 19D is provided on the vibrating plate 7 in the pump 1D of embodiment 4. The pump 1 of embodiment 1 and the pump 1D of embodiment 4 differ with respect to this point. Other than this point and matters described below, the pump 1D of embodiment 4 has the same configuration as the pump 1 of embodiment 1.

Thus, the protrusion 19D may be provided on the vibrating plate 7 in the pump 1D of embodiment 4. Backflow of fluid into the pump chamber 15 can also be prevented by the pump 1D of embodiment 4.

Embodiment 5

Figure 10:
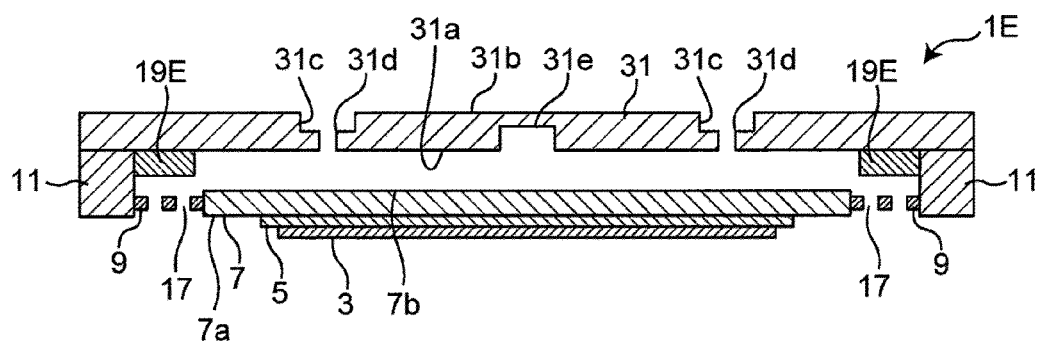
FIG. 10 is a schematic sectional view of a pump of embodiment 5.

Next, a pump 1E of embodiment 5 of the present disclosure will be described while referring to FIG. 10. FIG. 10 is a schematic sectional view of the pump 1E of embodiment 5.

A protrusion 19E is provided outside the vibrating plate 7 in the pump 1E of embodiment 5. The pump 1 of embodiment 1 and the pump 1E of embodiment 5 differ with respect to this point. Other than this point, the configuration of the pump 1E of embodiment 5 is identical to the configuration of the pump 1 of embodiment 1.

Thus, in the pump 1E of embodiment 5, the protrusion 19E is provided so as to protrude from the top plate 31 and the side wall 11 outside the vibrating plate 7 into the inside of the pump chamber 15. It is suitable that the distance between the outer peripheral edge of the vibrating plate 7 and the protrusion 19E be smaller than the distance between the vibrating plate 7 and the top plate 31. Backflow into the pump chamber 15 can be prevented with the pump 1E of embodiment 5 as well.

Figure 11:
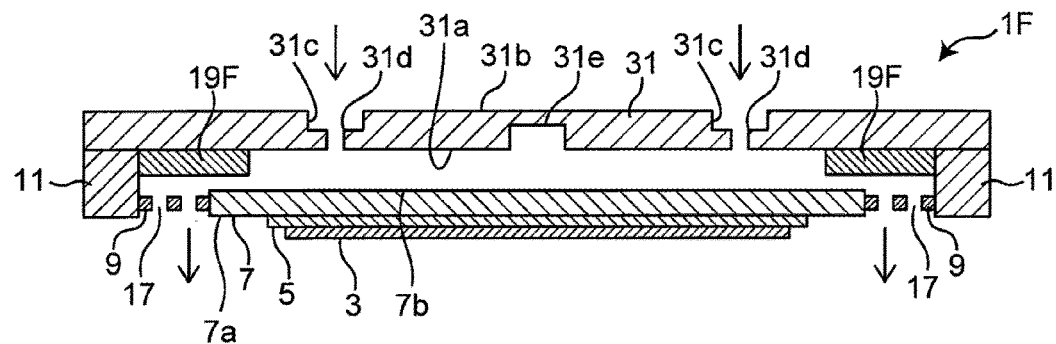
FIG. 11 is a schematic sectional view of a pump of a modification.
Figure 12:
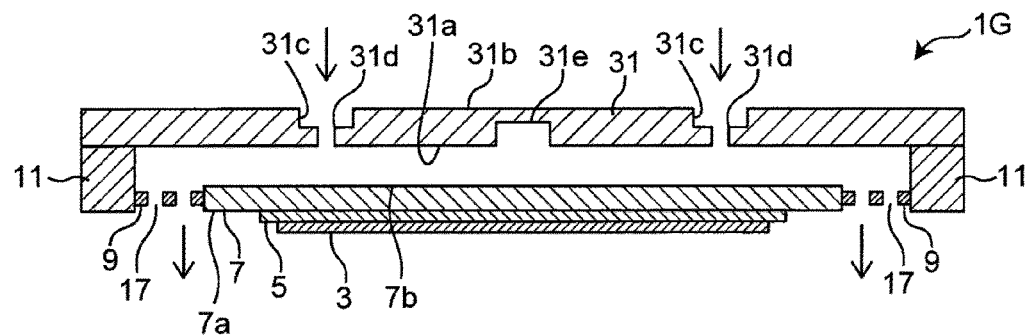
FIG. 12 is a schematic sectional view of a pump of a modification.

Next, the effects of the pumps according the above-described embodiments will be described while referring to FIGS. 11 and 12. FIGS. 11 and 12 are schematic sectional views of pumps according to modifications.

In a pump 1F illustrated in FIG. 11, the protrusion 19 of the pump 1 of embodiment 1 includes a protrusion 19F that extends up to the side wall 11. The rest of the configuration of the pump 1F is the same as that of the pump 1. In terms of pump performance, the pump 1F has a pump flow rate of 0.52 L/min and a pump pressure of 5 kPa at a drive voltage of 30 Vpp.

In addition, in terms of pump performance, the pump 1E of embodiment 5 illustrated in FIG. 10 has a pump flow rate of 2.13 L/min and a pump pressure of 1.1 kPa at a driving voltage of 30 Vpp.

A pump 1G illustrated in FIG. 12 has a configuration used for comparison and does not include the protrusion 19. The rest of the configuration of the pump 1G is the same as that of the pump 1. In terms of pump performance, the pump 1G has a pump flow rate of 1.79 L/min and a pump pressure of 0.7 kPa at a drive voltage of 30 Vpp.

The output performance of a pump can be easily determined as the product of the pump flow rate and the pump pressure. Therefore, the output performances of the pump 1F having the protrusion 19F and the pump 1E having the protrusion 19E are higher than the output performance of the pump 1G that does not have a protrusion. The backflow prevention effect increases as the distance between the outer edge of the vibrating plate 7 and the protrusions 19E and 19F becomes smaller. As a result, the pumps 1E and 1F respectively illustrated in FIGS. 10 and 11 have higher backflow prevention effects than the pump 1G illustrated in FIG. 12, and the output performance of the pumps 1E and 1F can be improved.

The pumps 1 to 1F of the above-described embodiments include: the vibrating plate 7 having the piezoelectric body 3 connected to the first main surface 7a thereof; the cover 10 including the top plate 31 that faces the second main surface 7b of the vibrating plate 7, which is on the opposite side from the first main surface 7a, and that has the opening parts 31d, and the side wall 11 that is connected to an outer peripheral portion of the top plate 31 so as to surround the pump chamber 15 between the top plate 31 and the vibrating plate 7; support portions 9 that are connected to the side wall 11 and support the outer periphery of the vibrating plate 7; the opening 17 that is formed along the outer periphery of the vibrating plate 7 between the side wall 11 and the vibrating plate 7; and the protrusions 19 to 19F that are each provided on any one out of the top plate 31, the side wall 11, and the vibrating plate 7 so as to protrude into the pump chamber 15. The protrusions 19 to 19F are each provided between the opening parts 31d of the top plate 31 and the side wall 11 in a cross section viewed in a direction perpendicular to a direction in which the first main surface 31a of the top plate and the second main surface 7b of the vibrating plate 7 face each other. With this configuration, backflow can be suppressed by the protrusions 19 to 19F and a large pump flow rate and a large pump pressure can be obtained. In each of the embodiments, a mode is illustrated in which the side wall 11 is connected to the top plate 31 without necessarily a gap therebetween, but a gap may be provided between part of the side wall 11 and the top plate 31 so long as the pump performance is not impaired.

In addition, similarly, in each embodiment, a mode is illustrated in which the side wall 11 itself does have an opening, but the side wall 11 may have an opening in part thereof so long as the pump performance is not impaired.

In addition, the protrusions 19 to 19B, 19E, and 19F are provided on the top plate 31 or the side wall 11. In addition, the shortest distance between the protrusions 19 to 19F and the vibrating plate 7 is smaller than the average interval between the vibrating plate 7 and the top plate 31. With this configuration, the fluid backflow suppression effect can be increased, and therefore the pump flow rate and the pump pressure can be increased.

Figure 13A:
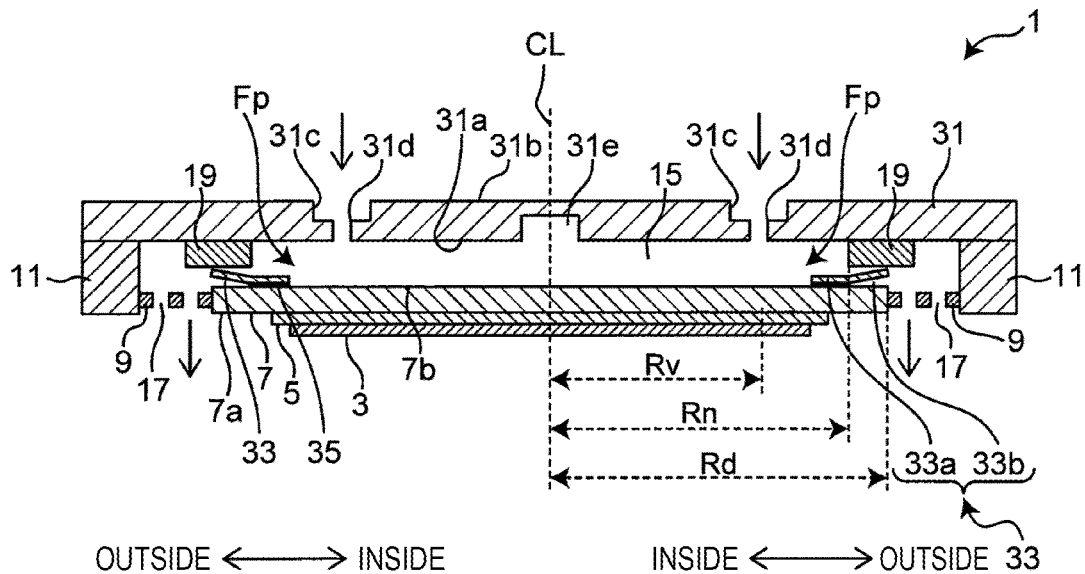
FIG. 13A is a schematic sectional view of a pump of a modification.
Figure 13B:
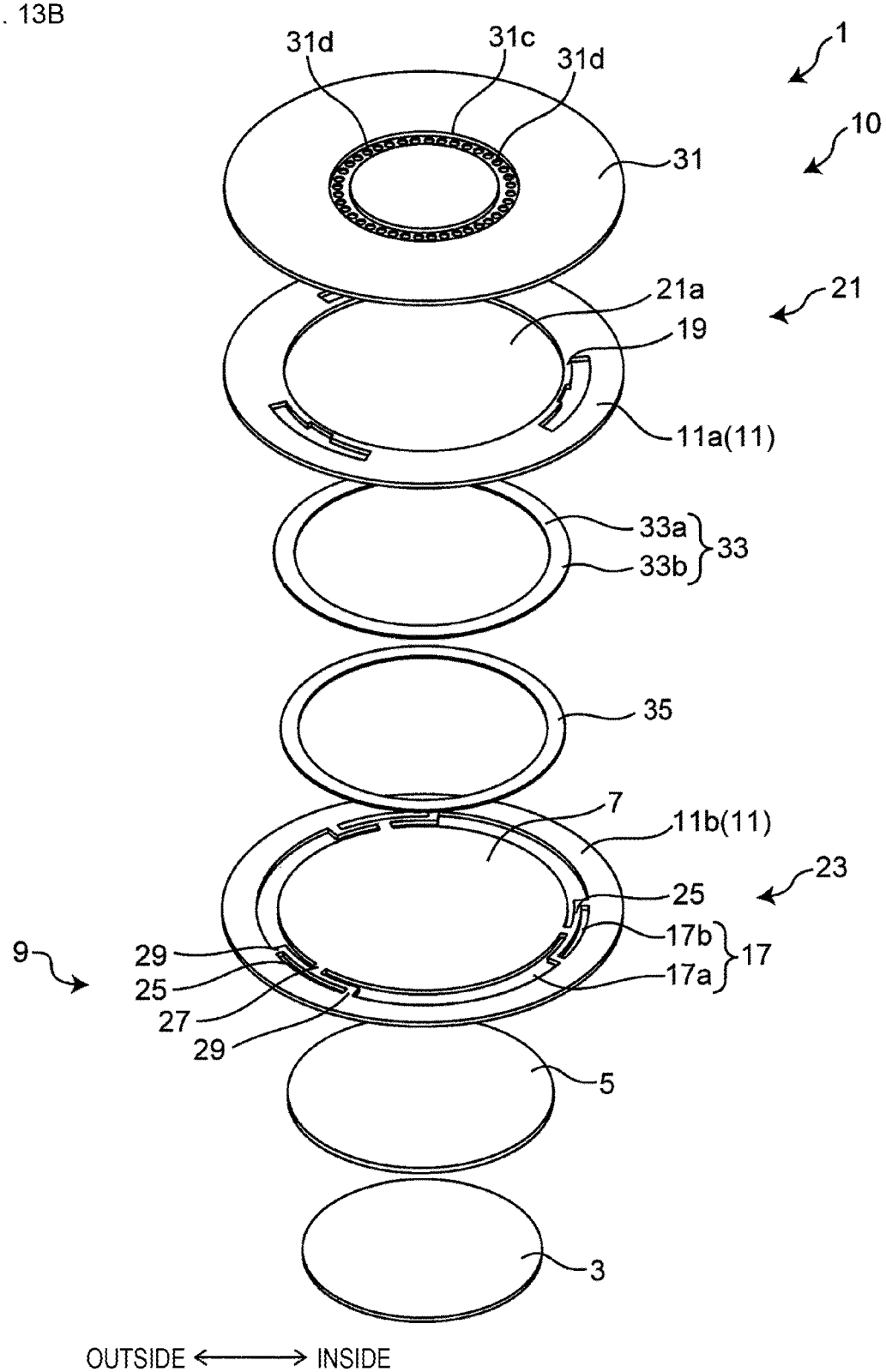
FIG. 13B is an exploded perspective view of the pump seen from a top plate side.
Figure 13C:
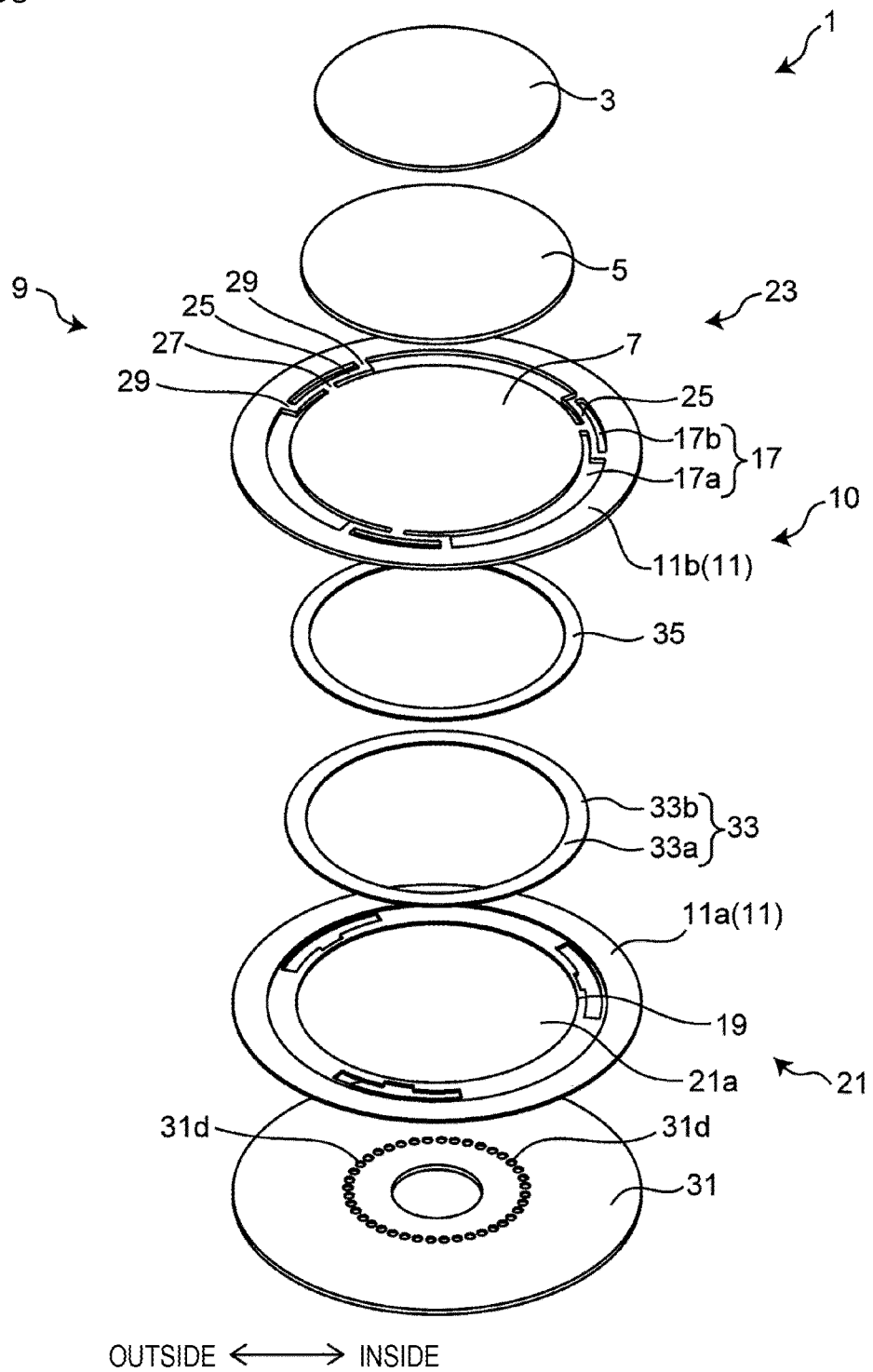
FIG. 13C is an exploded perspective view of the pump seen from a piezoelectric body side.
Figure 14:
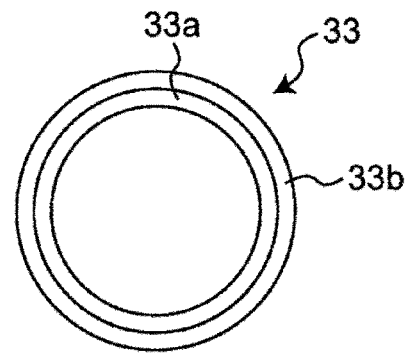
FIG. 14 is a plan view of a valve.

Next, a pump 1 that includes a valve 33 formed by a film-like member outside the opening parts 31d in a space between the vibrating plate 7 and the top plate 31 will be described while referring to FIGS. 13A to 14. FIG. 13A is a schematic sectional view of a pump 1 of a modification. FIG. 13B is an exploded perspective view of the pump 1 seen from a top plate side. FIG. 13C is an exploded perspective view of the pump 1 seen from a piezoelectric body side. FIG. 14 is a plan view of the valve 33. The backflow suppression effect can be improved and a high pump pressure can be obtained by providing the valve 33.

The film-like valve 33 has a ring-like shape as illustrated in FIG. 14 and includes, near the inner periphery thereof, an adhesive portion 33a that is adhered to the vibrating plate 7 and includes, near the outer periphery thereof, a movable portion 33b that serves an open end. The valve 33 may be adhered to the top plate 31 instead of the vibrating plate 7. The adhesive portion 33a is adhered to a surface of the vibrating plate 7 outside the opening parts 31d via a fixing member 35. Therefore, the airflow from the opening 17 to the opening parts 31d can be suppressed while the airflow from opening parts 31d to opening 17 is not so suppressed. Therefore, the backflow suppression effect realized by the protrusion 19 can be increased and the flow rate and the pressure can be increased. The fixing member 35 is, for example, an adhesive sheet. When the valve 33 is added to the vibrating plate 7 as illustrated in FIGS. 13A to 13C, the backflow prevention effect can be increased and the output performance of the pump can be increased. At this time, when part of the movable portion 33b of the valve 33 faces the protrusion 19, the backflow prevention effect is high.

In addition, the outer edge of the movable portion 33b of the valve 33 may face the protrusion 19. The pump flow rate is 1.4 L/min and the pump pressure is 5.6 kpa when the driving voltage is 30 Vpp. Although the valve 33 has a ring-like shape in FIGS. 13A to 13C, the valve 33 may instead have a circular plate-like shape. Thus, the inner side of the valve 33 is fixed to the vibrating plate 7 or the top plate 31, and the valve 33 includes, at the outer side thereof, the movable portion 33b that is formed of a movable film. The movable portion 33b can suppress airflow flowing from the opening 17 to the opening parts 31d. The movable portion 33b of the valve 33 has a part that faces the protrusion 19. Airflow from the opening 17 to the opening parts 31d can be suppressed to a greater degree as a result of the part of the movable part 33b that faces the protrusion 19 being close to or contacting the protrusion 19. In addition, the outer edge of the movable portion 33b of the valve 33 may face the protrusion 19.

The present disclosure is not limited to the above-described embodiments and can be implemented in the form of the following modifications.

Figure 15:
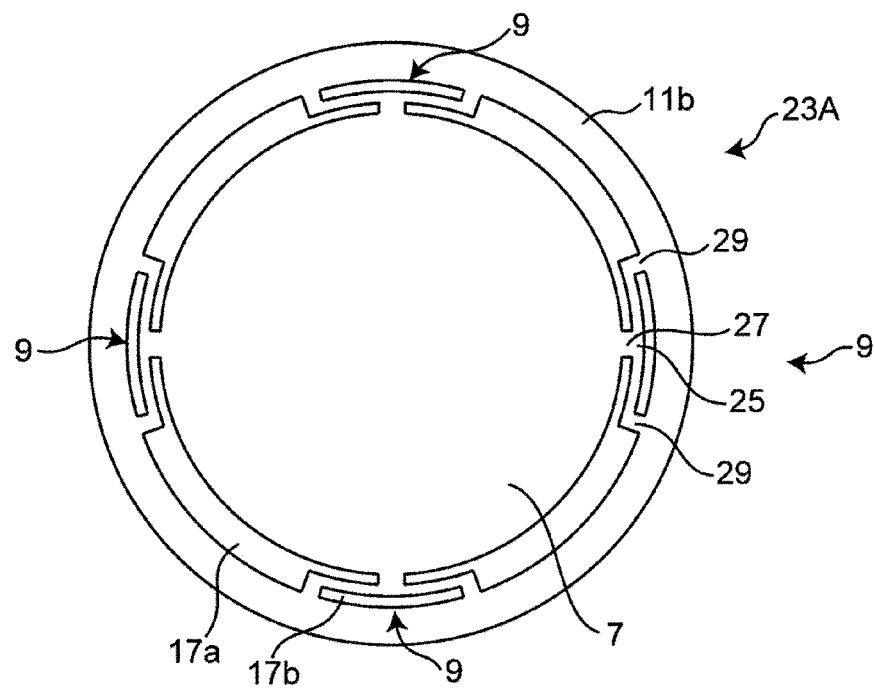
FIG. 15 is a plan view of a vibrating unit of a modification.

(1) In the above-described embodiments, the vibrating unit 23 has three support portions 9, but the present disclosure is not limited to this configuration. The vibrating unit 23 may have four or more support portions 9. As illustrated in FIG. 15, for example, a vibrating unit 23A has a support portion 9 arranged every 90°.

Figure 16:
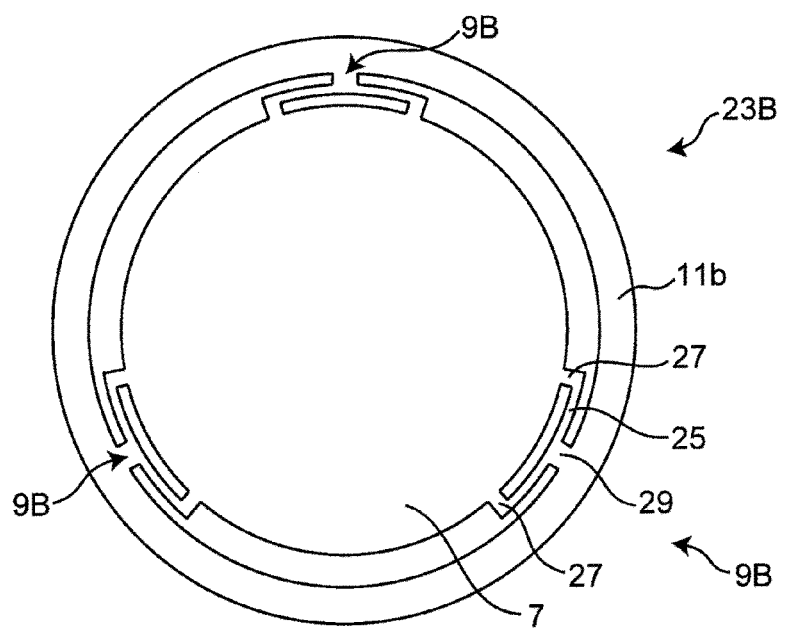
FIG. 16 is a plan view of a vibrating unit of a modification.
Figure 17:
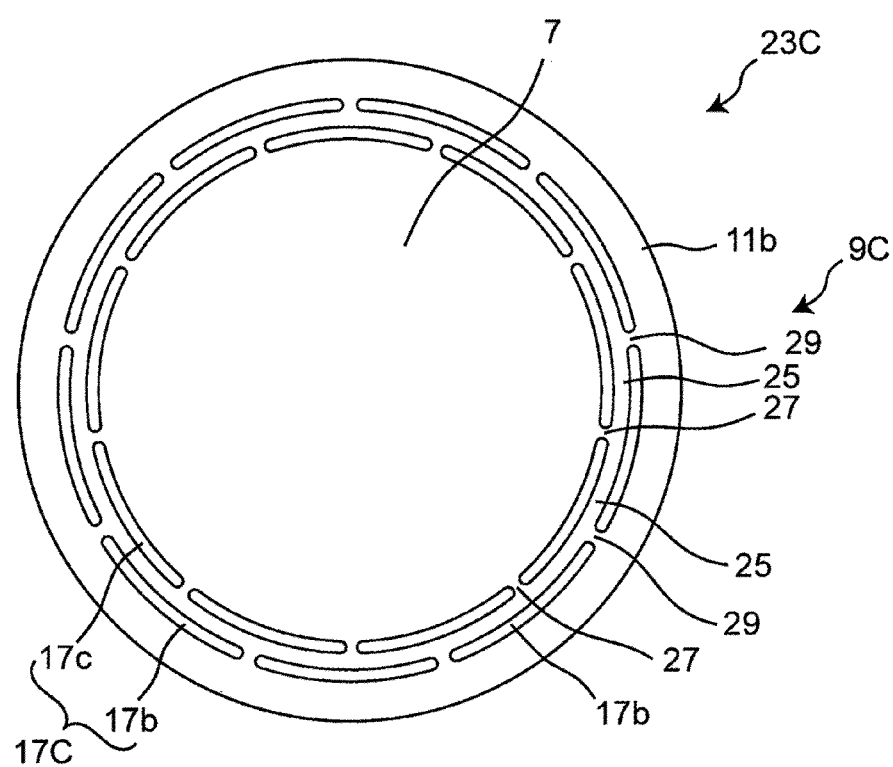
FIG. 17 is a plan view of a vibrating unit of a modification.

(2) In the above-described embodiments, as illustrated in FIG. 16, the vibrating plate 7 and a beam portion 25 of each support portion 9B of the vibrating unit 23 may be connected to each other using a two-part connection. In other words, the vibrating plate 7 and each beam portion 25 are connected to each other by two first connecting portions 27 in a vibrating unit 23B. Furthermore, each beam portion 25 and the side wall portion 11b may be connected to each other by one second connecting portion 29. In addition, as illustrated in FIG. 17, a vibrating unit 23C may be formed that has a structure in which a support portion 9c is formed along the side wall portion 11b and the beam portion 25 is formed in a ring-like shape. Openings 17C in the vibrating unit 23C include first openings 17c formed between the vibrating plate 7 and the beam portion 25 and second openings 17b. The first openings 17c are formed along the outer peripheral edge of the vibrating plate 7 and penetrate in the stacking direction.

(3) In each of the above-described embodiments, each support portion 9 includes the beam portion 25, but the beam portion is optional. The support portions 9 may be formed of a material having a lower elastic modulus than the vibrating plate 7, such as a resin like polyimide. Alternatively, the support portions 9 may be formed in a shape that is thinner than the vibrating plate 7. In both cases, similarly to as in the case where the support portions 9, each has a shape including a long beam portion 25, the support portions 9 are more flexible than the vibrating plate 7 and therefore the outer peripheral edge of the vibrating plate 7 is supported so as to be able to vibrate and the same effect is obtained.

INDUSTRIAL APPLICABILITY

The present disclosure can be applied to a pump that includes a piezoelectric body.

REFERENCE SIGNS LIST 1, 1A, 1B, 1C, 1D, 1E, 1F, 1G pump
3 piezoelectric body
5 auxiliary plate
7 vibrating plate
7a first main surface
7b second main surface
9, 9B support portion
10 cover
11 side wall
11a side wall portion
11b side wall portion
15 pump chamber
17 opening
17a, 17c first opening
17b second opening
19, 19A, 19B, 19D, 19E, 19F protrusion
21 side wall plate
21a opening
23, 23A, 23B vibrating unit
25 beam portion
27 first connecting portion
29 second connecting portion
31 top plate
31a first main surface
31b second main surface
31c recess
31d opening part
31e depression
31f symmetry point
33 valve
33a adhesive portion
33b movable portion
35 fixing member
CL center
Fp flow path

The invention claimed is:

1. A pump comprising:
a vibrating plate;
a piezoelectric body connected to a first main surface of the vibrating plate;
a cover including a top plate and a side wall,
the top plate facing a second main surface of the vibrating plate, which is on the opposite side from the first main surface of the vibrating plate,
the top plate having an opening part, and
the side wall being connected to an outer peripheral portion of the top plate so as to surround a space between the top plate and the vibrating plate;
a support portion connected to the side wall and supports an outer periphery of the vibrating plate;
a valve fixed to the top plate or the vibrating plate and disposed within said space between the top plate and the vibrating plate, said valve being positioned outside the opening part of the top plate when viewed in a direction parallel to the first main surface of the vibrating plate;
an opening between the side wall and the vibrating plate; and
a protrusion on any one out of the top plate, the side wall, and the vibrating plate so as to protrude into the space;
wherein the protrusion is in between the opening part of the top plate and the side wall in a cross section viewed in a direction parallel to the second main surface of the vibrating plate.

2. The pump according to claim 1,
wherein the vibrating plate has a circular plate shape.

3. The pump according to claim 1,
wherein the support portion has a beam shape that extends along an outer peripheral edge of the vibrating plate.

4. The pump according to claim 3,
wherein the support portion includes a beam portion, a first connecting portion that connects the vibrating plate to the beam portion, and a second connecting portion that connects the side wall to the beam portion, wherein the first and second connecting portions are radially offset from one another, and wherein three or more of the support portions are spaced apart from each other.

5. The pump according to claim 1,
wherein an average thickness of the support portion is smaller than an average thickness of the vibrating plate.

6. The pump according to claim 1,
wherein a Young's modulus of the support portion is lower than a Young's modulus of the vibrating plate.

7. The pump according to claim 1,
wherein the protrusion is on the top plate or the side wall.

8. The pump according to claim 7,
wherein a shortest distance between the protrusion and the vibrating plate is smaller than an average interval between the vibrating plate and the top plate.

9. The pump according to claim 8,
wherein the protrusion and the vibrating plate face each other.

10. The pump according to claim 1,
wherein the top plate has a point symmetrical shape including a center point, wherein the opening part is not located at the center point, and wherein the opening part of the top plate is in a ring shape.

11. The pump according to claim 1,
wherein the top plate and a surface of the protrusion that faces the top plate are connected to each other.

12. The pump according to claim 1,
wherein the top plate further comprises a recess outside the opening part of the top plate when viewed in a direction parallel to the first main surface of the vibrating plate.

13. The pump according to claim 1,
wherein the top plate further comprises a depression on a surface of the top plate facing the vibrating plate at a point nearer a center of the vibrating plate than a node of the vibrating plate when viewed in a direction parallel to the first main surface of the vibrating plate.

14. The pump according to claim 1,
wherein the valve is configured to restrict fluid flowing from the opening between the side wall and the vibrating plate toward the opening part of the top plate.

15. The pump according to claim 1,
wherein an inner side of the valve is fixed to the vibrating plate or the top plate, and the valve includes, at an outer side of the valve, a movable portion comprising a movable film.

16. The pump according to claim 15,
wherein the movable portion of the valve includes a part that faces the protrusion when viewed in a direction parallel to the first main surface of the vibrating plate.

17. The pump according to claim 16,
wherein an outer edge of the movable portion of the valve faces the protrusion when viewed in a direction parallel to the first main surface of the vibrating plate.

18. The pump according to claim 1,
wherein the pump further comprises an auxiliary plate between the vibrating plate and the piezoelectric body.

19. The pump according to claim 1, wherein the valve is radially aligned with the side wall in cross-section.

20. The pump according to claim 1, wherein said valve is positioned radially outside the opening part of the top plate when viewed in a direction parallel to the first main surface of the vibrating plate.

* * * * *